United States Patent [19]

Skoura

[11] Patent Number: 5,211,717
[45] Date of Patent: May 18, 1993

[54] SAWTOOTH CONTAINER FOR SEMICONDUCTOR WAFERS

[75] Inventor: Gilles Skoura, Grenoble, France

[73] Assignee: SGS-Thomson Microelectronics, S.A., Gentilly, France

[21] Appl. No.: 712,866

[22] Filed: Jun. 11, 1991

[30] Foreign Application Priority Data

Jun. 12, 1990 [FR] France .................. 2-07542

[51] Int. Cl.⁵ .............................................. B65D 73/02
[52] U.S. Cl. .................................. 206/328; 206/303; 206/509; 206/515; 220/4.24
[58] Field of Search .............. 220/380, 4.24, 4.21; 206/328, 303, 309, 503, 509, 515, 519

[56] References Cited

U.S. PATENT DOCUMENTS

| | | | |
|---|---|---|---|
| 3,208,589 | 9/1965 | Rayburn | 206/328 |
| 3,461,537 | 8/1969 | Lotz | 206/328 X |
| 3,534,146 | 10/1970 | Fell | 220/4.21 X |
| 3,552,548 | 1/1971 | Wallestad et al. | 206/328 |
| 3,661,253 | 5/1972 | Cronkhite . | |
| 3,664,538 | 5/1972 | Fioretti | 220/4.24 |
| 3,672,495 | 6/1972 | Baver et al. | 206/328 |
| 3,695,424 | 10/1972 | Cristy et al. | 206/509 X |
| 3,719,273 | 3/1973 | Abe | 206/328 |
| 4,013,296 | 3/1977 | Keeney | 206/309 X |
| 4,470,508 | 9/1984 | Yen | 206/303 X |
| 4,886,162 | 12/1989 | Ambrogio . | |

FOREIGN PATENT DOCUMENTS

| | | | |
|---|---|---|---|
| 0076773 | 11/1953 | Denmark | 220/4.24 |
| 1362872 | 11/1964 | France | 206/309 |
| 2246458 | 5/1975 | France | 220/4.24 |
| 2397334 | 2/1979 | France | 220/4.24 |

Primary Examiner—Bryon P. Gehman
Attorney, Agent, or Firm—Lowe, Price, LeBlanc & Becker

[57] ABSTRACT

A semiconductor wafer container comprises two identical parts, one forming the bottom and the other forming the lid. Each part has the overall shape of a disk defining a central axis (4) and comprises on a first surface a high number of protruding parts (6) arranged according to a peripheral circle and defined by intersecting plane surfaces which are obliquely slanted with respect to a plane corresponding to the disk. The protruding parts 6 are adjacently joined according to external (9) and internal (10) edges radially oriented with respect to the central axis (4) for forming a saw-tooth ring.

5 Claims, 3 Drawing Sheets

SAWTOOTH CONTAINER FOR SEMICONDUCTOR WAFERS

FIELD OF THE INVENTION

The present invention generally relates to containers designed for transporting and handling semiconductor wafers, and more particularly to a container for enclosing a single wafer.

BACKGROUND OF THE PRIOR ART

Containers designed to enclose a single semiconductor wafer are already known Such containers are generally used for carrying and handling wafers, while ensuring their physical protection. These wafers can be bare, partially processed, or entirely processed and may include integrated circuits.

The containers for semiconductor wafers known in the prior art are constituted by two parts, a first disk-shaped part forming the bottom, and a second part, having a similar shape, forming the lid. In this type of container, the lid and the bottom have matching peripheral surfaces, allowing these two parts to engage one into the other. This engagement may have some clearance, that is, it may be free or slightly forced, in order to provide coupling between the lid and the bottom. This engagement can ensure locking of the lid on the bottom, particularly further to the rotation of the lid with respect to the bottom.

The shape of the bottom and lid of the containers of the prior art is always slightly different. When it is desired to put wafers in such containers, it is necessary to manufacture then to simultaneously handle two sets of parts, a first set of bottoms and a second set of lids. Since the bottoms and the lids are generally made of the same material, particularly of a plastic material, and since, on the other hand, the bottoms and lids have relatively similar shapes, it is difficult to distinguish them and inversions may occur.

Since handling operations for loading wafers in containers or unloading them are often carried out by robots, separately handling bottoms and lids complicates the robot's operation. It is also difficult for a robot to lay a lid on a bottom while accurately adjusting the relative angular position of these two parts. To carry out such an operation, the robot must localize the angular position of the bottom, localize the angular position of the lid and accordingly rotate one of these two pieces. The implementation of these relatively complex functions is liable to malfunction and requires expensive equipment.

SUMMARY OF THE INVENTION

Accordingly, a principal object of the invention is to provide a container for semiconductor wafers which permits engagement of the container lid to the container bottom without requiring adjusting of the angular position of the lid with respect to the bottom.

Another object of the invention is to provide a container designed so as to avoid having to distinguish a lid from a bottom when loading a wafer in the container.

A further object of the invention is to provide a container, the bottom and lid of which are identical and liable to be piled up.

SUMMARY OF THE INVENTION

To attain these objects, in a preferred embodiment this invention provides a semiconductor wafer container comprised of two parts, one forming the bottom and the other forming the lid, wherein these two parts have an identical shape, each part having the general shape of a disk defining a central axis and comprising on a first surface a plurality of protruding parts arranged according to a peripheral circle and constituted by plane surfaces slanted with respect to the plane of the disk, joining according to external and internal edges radially oriented with respect to the central axis for forming a notched ring.

According to an embodiment of the invention, a peripheral shoulder is formed on the first surface, inside the ring, for accommodating and positioning the wafer.

According to an embodiment of the invention, a lateral notch in the ring and shoulder permits sliding of means for gripping the wafer under a wafer arranged on a part forming the bottom of the containers.

According to an embodiment of the invention, the parts are made of a plastics material, preferably an antistatic material.

According to an embodiment of the invention, the second surface of each part comprises a groove inside the ring for blocking the parts when they are piled up.

BRIEF DESCRIPTION OF THE DRAWINGS

The foregoing and other objects, features and advantages of the invention will be apparent from the following detailed description of a preferred embodiment as illustrated in the accompanying figures wherein.

DETAILED DESCRIPTION OF THE INVENTION

Figure 1:
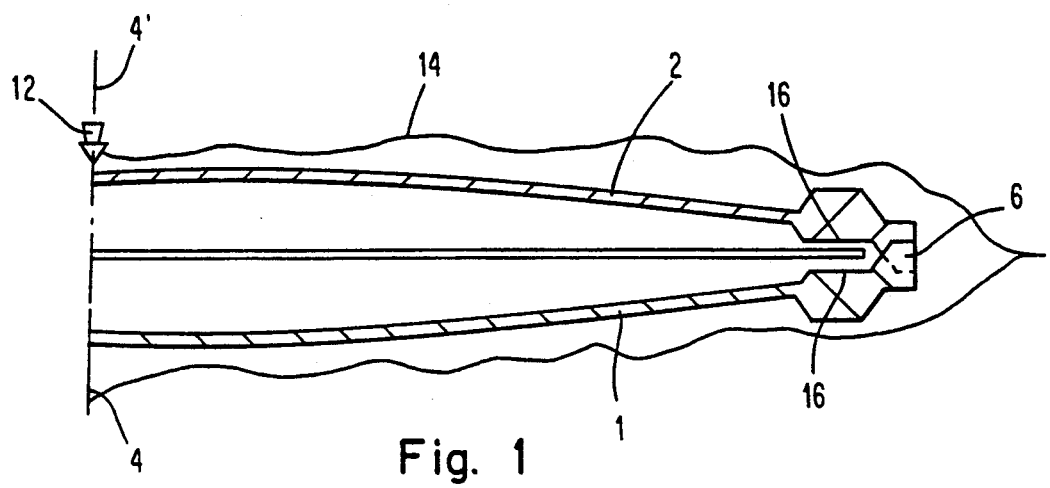
FIG. 1 is a half section view of an embodiment of a container according to the invention, with a lid and a bottom arranged in closed position, enclosing a semiconductor wafer.

FIG. 1 shows a container formed by two identical parts 1 and 2, part 1 forming the bottom and part 2 forming the lid. The container is in closed position, the lid 2 being placed on bottom 1. Before placing the lid on the bottom, a semiconductor wafer 3 is placed on the upper surface of bottom 1, then lid 2 is laid so that the central axis 4' of the lid differs only slightly from the central axis 4 of the bottom.

Each part 1, 2 has the overall shape of a disk and is preferably made of a moulded plastic material. When lid 2 is laid on bottom 1, some matched surfaces of these two parts, respectively, come into contact for providing centering of the lid with respect to the bottom, as well as blocking of the two parts for avoiding their respective displacement along a plane perpendicular to their central axes 4, 4', as long as a minimum force is applied for pressing the lid against the bottom. The characteristic of these matching parts is that they are strictly identical, both for bottom 1 and for lid 2.

Figure 2:
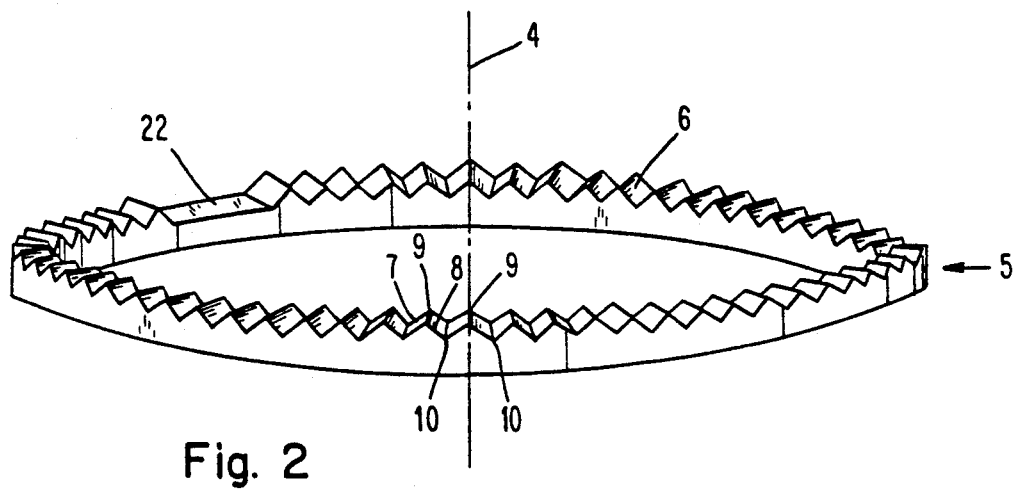
FIG. 2 is a perspective view of a container part according to the invention, this view being simplified so as to show in detail only the shape of the saw-tooth shaped protruding parts which are one of the features of the invention.

FIG. 2 shows in more detail the matching parts 5. The matching parts 5 are arranged according to a peripheral circle and are constituted by a series of equidistant protruding parts 6 forming a saw-tooth pattern. The protruding parts 6 are oriented according to the central axis 4 of the part. Each protruding part 6 is in the shape of a dihedral constituted by two plane faces 7, 8 oriented to be oblique with respect to the plane of the disk, e.g., a plane corresponding to the peaks of the dihedrals. These faces 7, 8 join outwardly to form an external edge 9 and join inwardly to form an internal edge 10. The external and internal edges 9, 10 are radially arranged with respect to the central axis 4. The sawtooth pattern thus circumferentially extends over both parts of the container.

When the two parts 1, 2 are placed one on top of the other, the two saw-tooth patterns engage one into the other and establish a coupling between the two parts 1, 2, this coupling resisting relative displacement of the two parts along a plane perpendicular to the central axis 4. Indeed, disregarding the orientation of an effort applied perpendicularly to the central axis 4 on one of parts 1, 2 of the container, there always are at the circumferential strip 5 some protruding parts 6, the edges 9, 10 of which are oriented substantially perpendicularly to the direction of this effort. These protruding parts 6 then resist the relative displacement of parts 1 and 2 provided a predetermined pressure is applied (arrow 12) from a part 2 against the other part 1.

On the other hand, it is not necessary to position the two parts 1, 2 in a perfectly concentric way when they are assembled to form the container.

Indeed, if a slight difference occurs during this operation between the relative positions of the central axes 4 and 4' of parts 1, 2, the saw-tooth protruding parts 6 present on the two parts 1, 2 make contact and the oblique faces 7, 8 slide one over the other and then automatically realign both parts 1, 2. Of course, the difference between the two central axes 4 and 4' must be smaller than the distance "d" separating an external edge 9 from an adjacent internal edge 10 as determined in a plane perpendicular to the central axis 4.

Similarly, if there is a rotation difference between an external edge 9 of one of the part and an internal edge of the facing part, realignment is automatically achieved resulting from gravitation as soon as a part is placed on top of the other.

For containing a wafer 3 having a diameter of about 100, 125 or 150 mm, the protruding parts 6 preferably may have a pitch of about 4 mm and a radial length of about 3 mm. For such an arrangement, the difference between the central axes 4 and 4' during mounting of the two parts 1, 2 may reach about 2 mm. Such a positioning accuracy can easily be reached by using a robot.

The two parts 1, 2 forming a container can be maintained in closed position by applying a predetermined force (arrow 12) to draw them closer. It is possible to use air pressure for constantly generating such a force. For this purpose, once a wafer 3 is laid onto a bottom 1 and a lid 2 is placed above, this unit is introduced into a flexible plastic envelope 14, best seen in FIG. 1, and then a vacuum is generated inside the envelope, which is then airtight sealed. Under these conditions, air pressure permanently applies a pressure on both sides of parts 1 and 2 forming the container, which provides the coupling thereof.

Preferably, each part 1, 2 has a peripheral shoulder 16 supporting a wafer 3. The size of shoulders 16 can allow for a predetermined interval between wafer 3 enclosed in the container and these shoulders. In that case, wafer 3 can move slightly when it is enclosed in the container. It is also possible to provide the size of these shoulders 16 so that, when wafer 3 is enclosed in the container, the two facing surfaces 16 are pressed against the periphery of the opposite surfaces of the wafer, to block the latter.

Figure 3:
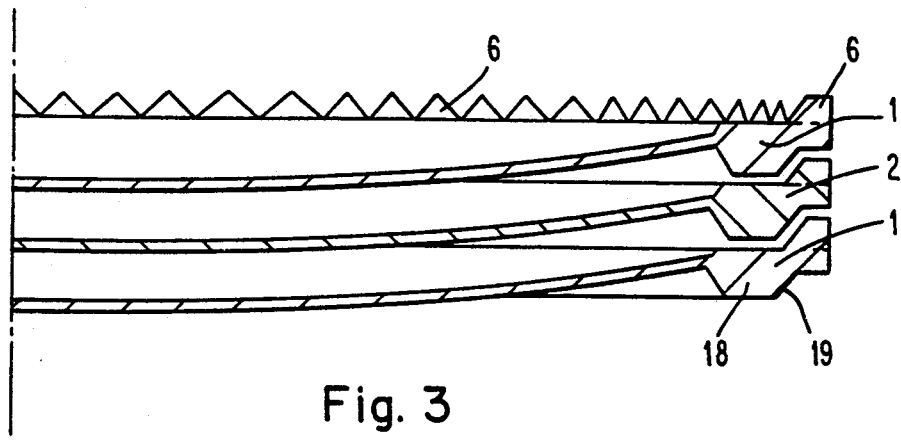
FIG. 3 is a half section view of a pile of parts constituting the containers corresponding to the one shown in FIG. 1.

The shape of parts 1, 2 constituting a container may allow a user to pile them up when they are all arranged in the same direction. FIG. 3 shows three container parts piled up one over the other. To be piled up, parts 1, 2 comprise on their external surface a circular ridge 18, the external diameter surface of which is substantially equal to the internal the internal diameter of surface 17 of the sawtooth structures 6. The external surface 19 and internal surface 17 have a complementary conical shape to facilitate their engagement.

With the invention, it is possible to manufacture a single type of parts and to feed a robot from a single pile of parts. The robot grips a first part that it horizontally arranges, then it grips a wafer that it lays into the first part, lastly it grips another part from the pile that it turns over to lay it on top of the first part.

It is also possible to provide two piles of parts, these two piles being arranged in opposite directions one with respect to the other. In that case, the robot grips a part from the first pile, lays a wafer onto this part (which forms a bottom), then grips a part from the second pile and lays this second part (which forms a lid) on top of the first part. In this case, the robot does not need to be equipped with means for turning over a part of the container. Although the robot is fed with two different piles, one for forming bottoms, the other for forming lids, due to the fact these two piles contain identical parts, it is possible to simplify the handling of both piles of parts.

Figure 4:
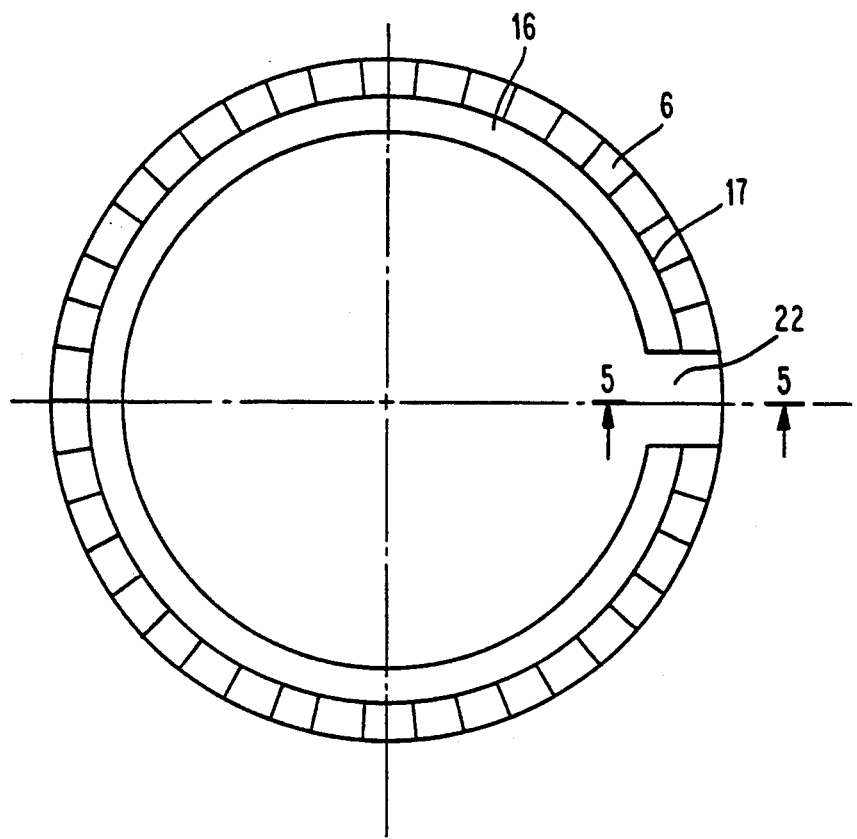
FIG. 4 is a plan view of another embodiment of a container according to the invention.
Figure 5:
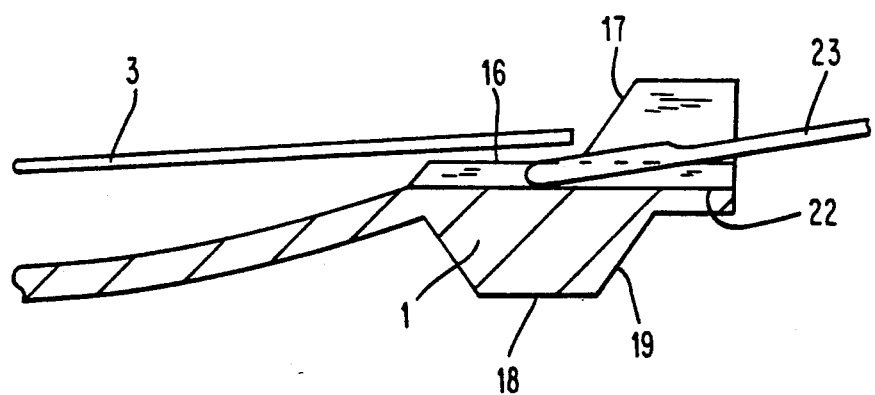
FIG. 5 is a partial section view enlarged along line 5—5 of FIG. 4, this view showing means intended to grip a wafer placed in the container.

FIG. 4 is a top view of a part 1 or 2 of the container. A notch 22 is laterally provided. This notch is also shown in FIG. 5. The notch 22 permits slipping in of a vacuum pipette 23 beneath a wafer 3 arranged on shoulder 16, for gripping the wafer by its rear face. Notch 22 requires the omission of a small number of protruding parts 6. The number of the omitted protruding parts being relatively low, this causes no malfunction of the engagement and positioning mode of the two parts 1 2 constituting a container.

Preferably, the parts forming a container are made of an antistatic plastic material, that is, a material having a predetermined electric conductivity. Antistatic plastic materials generally are black and opaque. In that case, since the bottoms and lids are perfectly identical, it may be useful to fix on the bottom or the lid a label indicating which is the upper surface of wafer 3 enclosed in the container. It is also possible to fix such a label on the plastic envelope 14 which encloses the container per FIG. 1.

During mounting or dismounting of a container according to the invention, the container parts going into contact do not rub too much one against the other, but are simply posed one on top of the other and slide at the oblique faces of the protruding parts 6 because of gravity. This causes very limited friction which generates practically no particles or wear phenomena. Cleanliness of the containers thus constituted is consequently not downgraded by the mounting operation.

In this disclosure, there are shown and described only the preferred embodiments of the invention, but, as aforementioned, it is to be understood that the invention is capable of use in various other combinations and environments and is capable of changes or modifications within the scope of the inventive concept as expressed herein.

Figure 6:
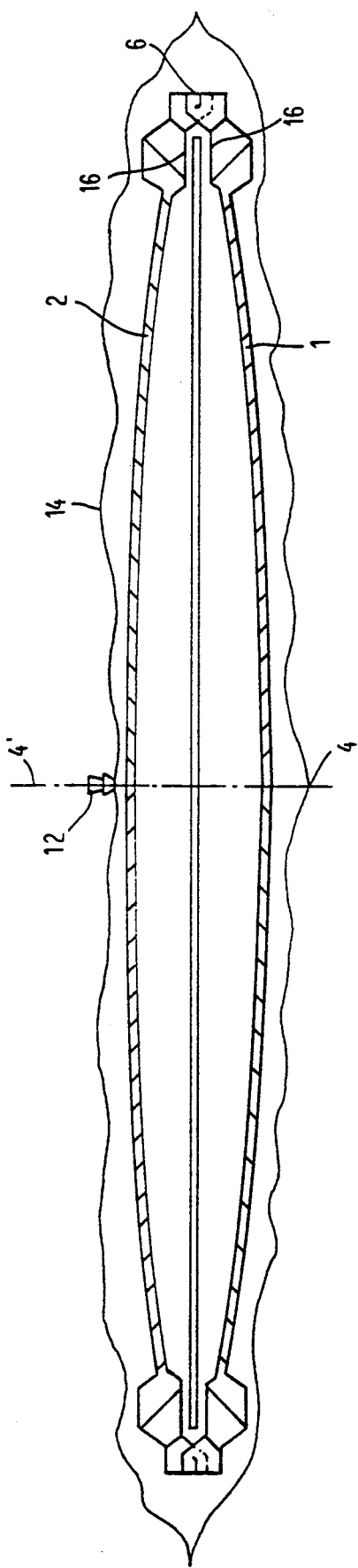
FIG. 6 is a sectional view of an embodiment of a container according to the invention, arranged in a closed position, enclosing a semiconductor wafer.

FIG. 6 depicts a container in a closed position, formed by two identical parts 1 and 2, part 1 forming the bottom and part 2 forming the lid. The structural elements are the same as those of the container depicted in FIG. 1.

I claim:

1. A container system for containing a semiconductor wafer, comprising:
   a container formed of two identical parts, one forming the bottom and the other forming the lid of the container, each part substantially forming a disk defining a central axis and having an internal first surface and an external second surface, wherein each part comprises on said first surface a plurality of protruding parts arranged according to a peripheral circle to form a saw-tooth ring, each protruding part being defined by two intersecting plane surfaces which are slanted with respect to a plane containing external edges of the intersecting plane surfaces, said external edges being radially oriented with respect tot he central axis, said first surface having a first generally conical surface within said saw-tooth ring; and
   a flexible envelope made of a selected plastic material, shaped and sized so that the two parts cooperating to form the container can be placed therein and held together by providing a vacuum to the inside of the flexible envelope
   wherein said second surface comprises a circular ridge which is defined in part by a second generally conical surface formed to fit to said first generally conical surface inside said saw-tooth ring for blocking an adjacent part when a plurality of parts are piled up with respect to one another.

2. A container according to claim 1, further comprising:
   a peripheral shoulder formed on said first surface, within a perimeter of said saw-tooth ring, for accommodating and positioning a wafer placed inside the bottom part.

3. A container according to claim 2, further comprising:
   a lateral notch formed in said saw-tooth ring and said shoulder to enable sliding, under a wafer resting on the bottom of the container, of a means for gripping said wafer.

4. A container according to claim 1, wherein:
   said parts are made of a plastic material.

5. A container according to claim 4, wherein:
   said plastic material is an antistatic material.

* * * * *

UNITED STATES PATENT AND TRADEMARK OFFICE
CERTIFICATE OF CORRECTION

PATENT NO. : 5,211,717
DATED     : May 18, 1993
INVENTOR(S) : Gilles SKOURA

It is certified that error appears in the above-identified patent and that said Letters Patent is hereby corrected as shown below:

```
    On the title page, please amend the foreign
application priority data to read as follows:
--Jun. 12, 1990 [FR]  France .......... 90-07542--
```

Signed and Sealed this

Twenty-eighth Day of December, 1993

*Attest:*

BRUCE LEHMAN

*Attesting Officer*    *Commissioner of Patents and Trademarks*